United States Patent [19]

Fletcher, Jr.

[11] Patent Number: 4,507,746
[45] Date of Patent: Mar. 26, 1985

[54] PROGRAMMABLE MATCHED FILTER FOR BINARY PHASE-CODED SIGNALS

[75] Inventor: Robert H. Fletcher, Jr., Westlake Village, Calif.

[73] Assignee: The United States of America as represented by the Secretary of the Army, Washington, D.C.

[21] Appl. No.: 402,503

[22] Filed: Jul. 28, 1982

[51] Int. Cl.$^3$ ............................................. G06F 1/02
[52] U.S. Cl. ................................................. 364/717
[58] Field of Search ............ 364/768, 717, 715, 200, 364/900, 758, 786, 784, 736, 787; 368/156, 200, 218, 73, 156

[56] References Cited

U.S. PATENT DOCUMENTS

| | | | |
|---|---|---|---|
| 4,225,935 | 9/1980 | Zscheile, Jr. et al. | 364/717 |
| 4,254,471 | 3/1981 | Hunt | 364/784 |
| 4,320,513 | 3/1982 | Lampert | 364/717 |
| 4,450,321 | 5/1984 | Quigley et al. | 364/717 |

OTHER PUBLICATIONS

Thomas L. Floyd, "Digital Fundamentals", 1977, pp. 122, 173 and 178.

*Primary Examiner*—Gareth D. Shaw
*Assistant Examiner*—Tim A. Wiens
*Attorney, Agent, or Firm*—Anthony T. Lane; Robert P. Gibson; Robert C. Sims

[57] ABSTRACT

A programmable digital device designed to perform a matched filtering operation on arbitrary binary phase-coded signals. The technique is used in secure communication systems and for various radar and missile fuzing operations. The essential features minimize the component by the specific networks for the summing units containing unique combinations of digital components. The output is converted to sign-magnitude format.

3 Claims, 9 Drawing Figures

PROGRAMMABLE MATCHED FILTER FOR BINARY PHASE-CODED SIGNALS

DEDICATORY CLAUSE

The invention described herein may be manufactured, used, and licensed by or for the Government for governmental purposes without the payment to me of any royalties thereon.

DESCRIPTION OF THE BEST MODE AND PREFERRED EMBODIMENTS

Figure 1:
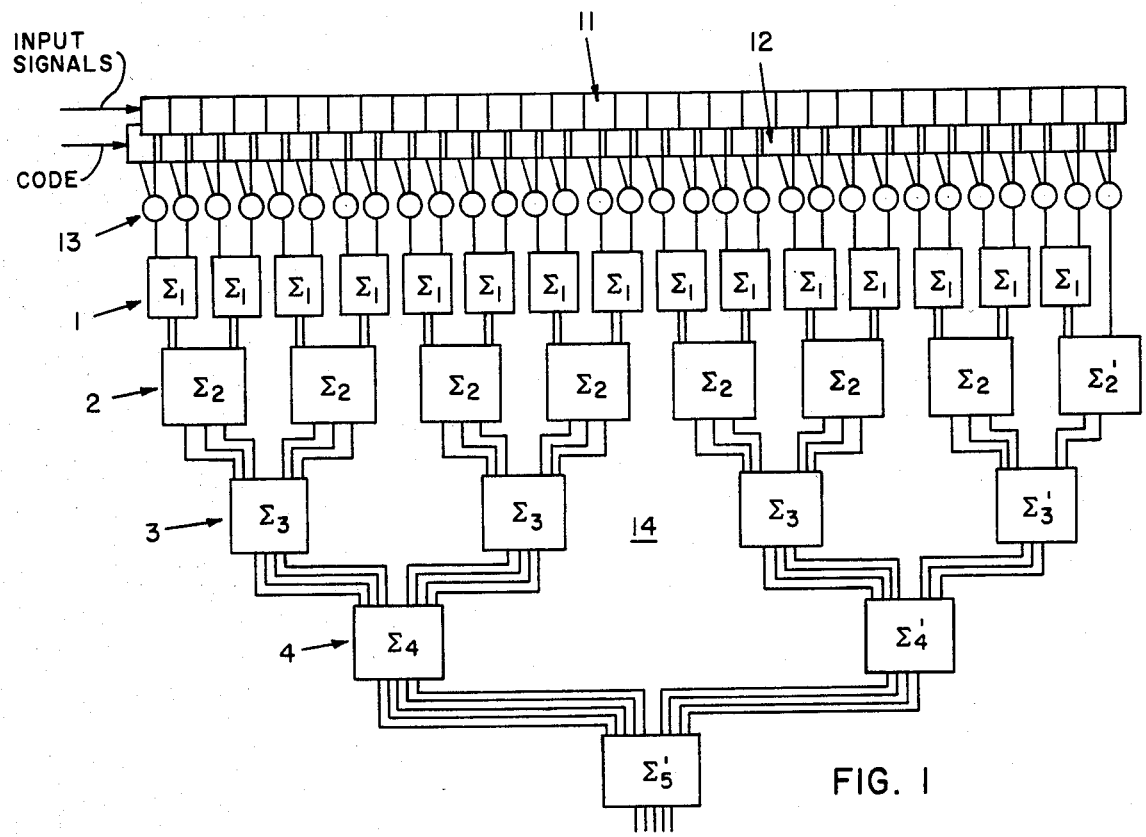
FIG. 1 illustrates a matched filter for 31 bit binary phase-coded signals.

There are numerous types of pseudo-random codes suitable for modulating waveforms in radar and communication systems. One of the most popular is the class of maximal-length sequence, or m-sequence, codes. In addition to having desired statistical properties, these codes are also very easily generated with a shift register and some Exclusive-OR gates. Specifically, a shift register having n stages can be used to generate a code of length $N=2^n-1$. Due to the popularity of these codes, the discussion of the matched filters in this patent application is centered on the m-sequence codes, and component counts are given for these codes as a function of their lengths. However, it should be emphasized that due to the programmable nature of the filter, any type of code may be used, provided, of course, that the code length does not exceed the size of the filter. While the specific values of the component count will differ from those given for m-sequence codes, the number of components will still be minimized for the particular code of interest.

To illustrate the matched filter, an m-sequence code of length 31 is assumed; i.e., $n=5$, $N=31$. The matched filter for this code is given in FIG. 1. A signal shift register 11 receives the input signals. The code is loaded into the reference shift register 12 and remains fixed (even with changing input signals) until the code is changed. Exclusive-OR gates 13 couple the coded signal to the summing networks 14. The shift registers, gates and summing units are clocked (not shown) at the code bit rate.

The programmable feature is obtained by use of the two shift registers 11 and 12 and the bank of Exclusive-OR gates 13. The reference code is loaded into register 12 and the incoming signal, after appropriate pre-processing and digitizing, is fed into the register 11. If the same code were to be used always, then the reference code shift register and the Exlusive-OR gates would not be needed. The signal shift register stages would simply be hard-wired to the $\Sigma_1$ units either directly or through an inverter, depending on the bit arrangement of the code.

Normally, the outputs of the Exclusive-OR gate would be inverted so that a "match" in the signal and reference codes would produce a logical 1 output instead of the logical 0 of the proposed design. These inverters are not actually needed here, however. In fact, the output formatting circuitry is also simpler if the inverters are not used.

The units 14 designated by $\Sigma_1$, $\Sigma_2$, $\Sigma_3$, $\Sigma_4$, $\Sigma_2'$, $\Sigma_3'$, $\Sigma_4'$ and $\Sigma_5'$ are all summing networks for adding the appropriate signals entering the unit. The $\Sigma_j$ units add two j-bit numbers to give one (j+1)-bit number. The $\Sigma_j'$ units add a j-bit and a (j−1)-bit number to give a j-bit sum. $\Sigma_j$ is a notational representation for the units $\Sigma_1$, $\Sigma_2$, $\Sigma_3$, $\Sigma_4$ in FIG. 1, i.e., $\Sigma_j$, $j=1, 2, 3, 4$. Since the invention applies for arbitrary code lengths N, for which FIG. 1 is a specific example with $N=31$, it is necessary to use a general notation such as $\Sigma_j$ to indicate the arbitrary summing units. The same comments hold for the $\Sigma_j'$ units with the exception that these units add a j-bit binary number and a (j−1)-bit binary number to give a j-bit sum. These units are shown specifically in FIGS. 2–8.

Figure 2:
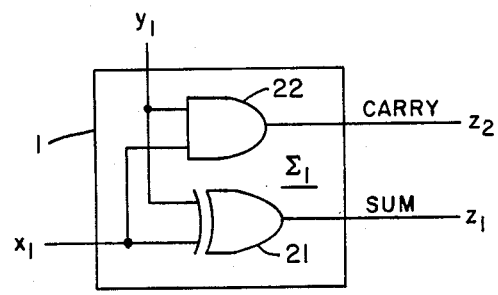
FIG. 2 illustrates the sum diagram for the first level of the networks illustrated in block form in FIG. 1.
Figure 3:
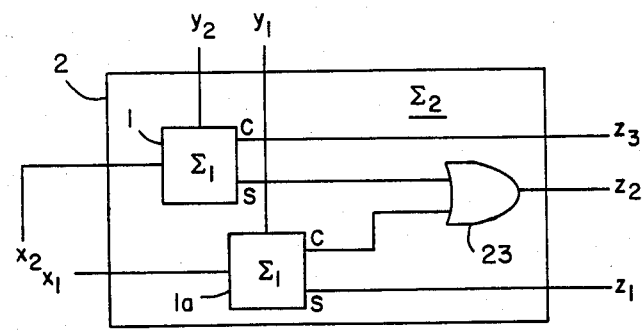
FIG. 3 illustrates the summing diagrams for the second level of the networks of FIG. 1.
Figure 4:
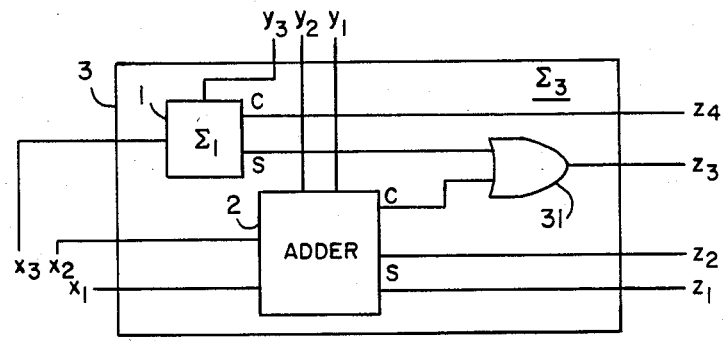
FIG. 4 illustrates the third level of the networks illustrated in FIG. 1.
Figure 5:
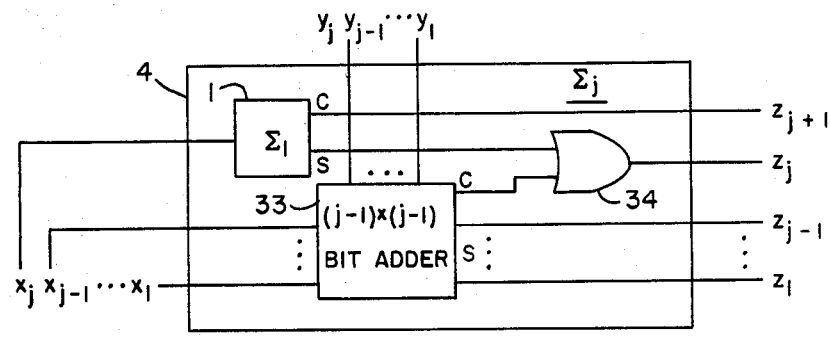
FIG. 5 is a generic representation of the summing networks to carry out the invention for any high level requirement.

FIGS. 2–8 describe the summer units which form the basic building blocks of the matched filter. FIG. 2 gives the circuit diagram for $\Sigma_1$. It accepts two input words each 1 bit long, i.e., $(x_1)$ and $(y_1)$, and produces the 2 bit output word $(z_2 z_1)$. $Z_2$ and $Z_1$ cannot both be binary ones, as the sum of two "one" bit words cannot be a binary three. Similarly, the network of FIG. 3 accepts the two input words, $(x_2 x_1)$ and $(y_2 y_1)$, each 2 bits long, and produces the 3 bit output word $(z_3 z_2 z_1)$ which can only have a maximum value of a binary four. FIG. 4 repeats this for 3-bit input words and FIG. 5 gives the general diagram for arbitrary j-bit input words. The maximum possible value of each output word is the value of its highest order bit.

Figure 6:
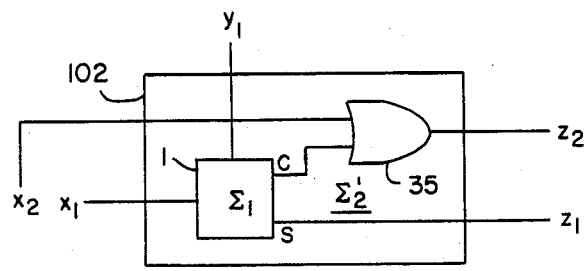
FIGS. 6 thru 8 illustrate the prime networks of the levels shown in FIG. 1 including the generic level.
Figure 7:
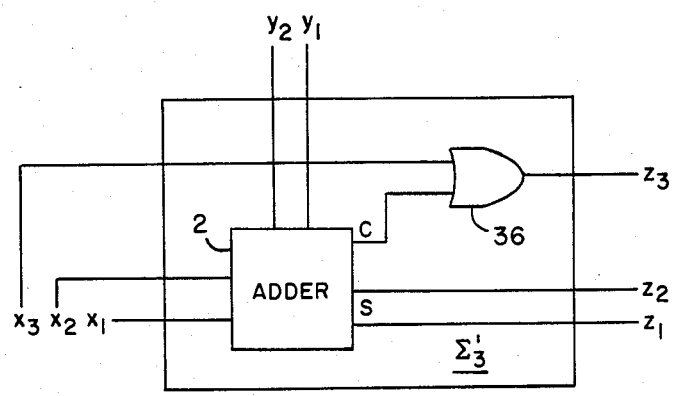
Figure 8:
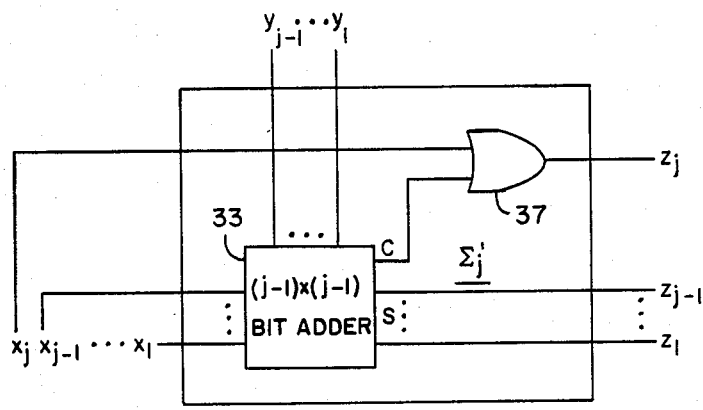

FIGS. 6–8 portray the similar networks that are used in the matched filter for the summing units which have different length input words. For example, in FIG. 6 the inputs are a 2-bit word $(x_2 x_1)$ and a 1-bit word $(y_1)$ and the output is the 2-bit word $(z_2 z_1)$.

Figure 9:
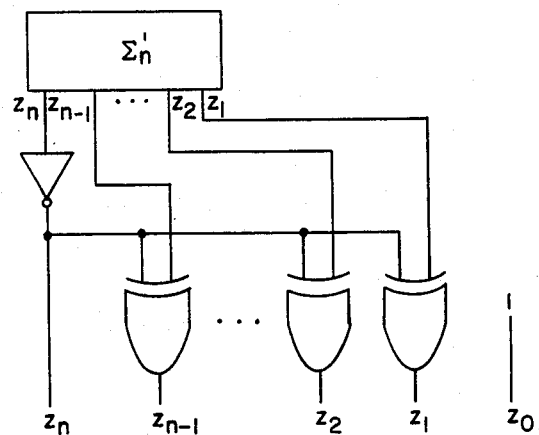
FIG. 9 illustrates converter circuitry to interconnect different formats.

FIG. 9 provides the output circuitry that converts the final matched filter output, for example, the output of $\Sigma_5'$ in FIG. 1, from offset binary to sign-magnitude format. This is a useful feature which, depending on subsequent processing, may or may not be necessary.

The important feature of notice is that the $\Sigma_j$ units, for $j>1$, do not require the full(j)X(j) adders normally expected. (Similar comments apply for the $\Sigma_j'$ units.) Specifically, the $\Sigma_j$ units require a (j−1)X(J−1) adder, a half-adder and an OR gate. This may result in a significant saving in hardware components.

For M-sequence codes generated by n-stage shift registers, the output of the appropriate matched filter is obtained from $\Sigma_n'$. This output is in an offset binary format and it is frequently desirable to convert this to a sign-magnitude word. The circuitry of FIG. 9 will accomplish this. Had inverters been used on the outputs of the first bank of Exclusive-OR gates of the matched filter, then the single inverter shown would not be needed. However, each of the Exclusive-OR outputs would then need inverters. Therefore, the total savings from this aspect alone are $2^n+n-3$ inverters.

A simplified description of the operation of the programmable matched filter for performing radar pulse compression is as follows: The desired code is generated and used to bi-phase modulate the transmitted waveform. At the same time the code is loaded into the reference shift register 12 of the matched filter, and the signal shift register 11 is loaded with all 0's (or all 1's). The radar return signal is amplified, mixed down to video (with I and Q channels, if desired) and detected with a zero-crossing detector which samples the signal at the bit rate of the code. Depending on the polarity of the signal, either a 1 or 0 is loaded into the signal shift register 11. As soon as the shift register has been toggled, the Exclusive-OR gates are activated and summing operations are begun. This process is repeated at each bit interval. For very short bit intervals and long codes, it may be required that different levels of the summing circuitry operate concurrently so that the filtering can be accomplished in real-time. At the end of the receive time, the remaining summations are performed and the circuitry is ready to repeat the process with the next pulse.

EXPLANATION OF THE SUMMING UNITS

In addition to the reduction of inverters, as discussed above, significant component savings are obtained through the use of the $\Sigma_j$ and $\Sigma_j'$ units rather than the summing circuits normally expected. The use of these units can be justified by considering the input/output tables for both decimal and binary implementations. In the decimal system, the inputs to the first summer $\Sigma_1$ are $+1$ and $-1$; the equivalent binary inputs are 1 and 0. The output values are given in Table 1 below:

TABLE 1

SUMMATION UNIT $\Sigma_1$ OUTPUTS FOR ALL POSSIBLE INPUT VALUES

Decimal

| $\Sigma_1$ Input | + | +1 | −1 |
|---|---|---|---|
| | +1 | +2 | 0 |
| | −1 | 0 | −2 |

Binary

| Input | + | 1 | 1 |
|---|---|---|---|
| | 1 | 10 | 01 |
| | 0 | 01 | 00 |

Notice that there are only three output combinations and that binary and decimal outputs are uniquely related. An output of 11 is impossible. Since the outputs of two $\Sigma_1$ units are the inputs to $\Sigma_2$, the decimal and binary output tables for $\Sigma_2$ are defined as shown below in Table 2. The 11 inputs are omitted as such are not possible in this system.

TABLE 2

SUMMATION UNIT $\Sigma_2$ OUTPUTS FOR ALL POSSIBLE INPUT VALUES

Decimal

| $\Sigma_2$ Input x | + | 2 | 0 | −2 |
|---|---|---|---|---|
| | 2 | 4 | 2 | 0 |
| | 0 | 2 | 0 | −2 |
| | −2 | 0 | −2 | −4 |

Binary

| Input x | + | 10 | 01 | 00 |
|---|---|---|---|---|
| | 10 | 100 | 011 | 010 |
| | 01 | 011 | 010 | 001 |
| | 00 | 010 | 001 | 000 |

The essential feature of this invention is illustrated by the above tables. Although $\Sigma_2$ has two 2-bit input values to sum, the input 11 never occurs on either input. This reduces the number of possible combinations to the 3×3 matrix shown. Consequently, a normal (2-bit)X(2-bit) adder is not required, and the circuitry given earlier is sufficient. Moreover, since 100 is the only output of $\Sigma_2$ having a 1 in the third bit position, it is seen that the reduction in the number of combinations propagates through the filter. (For example, there are only five possible values, rather than the usual eight, that either input to $\Sigma_3$ can assume.) Similarly, an arbitrary summer $\Sigma_j$ has two j-bit inputs. However, as shown in FIG. 5, it requires only a (j−1)X(j−1)-bit summer plus a $\Sigma_1$ unit and an OR gate. Completely analogous comments apply to the $\Sigma_j'$ summation units.

In general terms, "filtering" describes the processing operation performed on a signal or waveform to accomplish some objective. For this disclosure, the more important consideration is that I am describing a "matched filter". A "matched filter" is the processing procedure, or piece of equipment, that operates on a signal to maximize the output signal-to-noise ratio.

The most fundamental part of this invention is illustrated by FIGS. 2-8, which provide the network diagrams for the various summing units. As discussed above, the summing units with two j-bit input words require a (j−1)x(j−1)-bit full adder plus a half adder (a $\Sigma_1$ unit) and an OR gate. The units which add a j-bit word and a (j−1)-bit word are indicated by $\Sigma_j'$. As shown above these require a (j−1)x(j−1)-bit adder and an OR gate. Thus, the hardware requirements may be substantially reduced over the conventional implementation of using a full jxj-bit adder to add two j-bit input words.

FIG. 1 provides a specific example of the means of interconnecting the summing units ($\Sigma_j$ and $\Sigma_j'$) for a programmable 31-bit code. This basic approach can be readily applied to any arbitrary code length, either fixed or programmable. Operationally this figure describes the processing steps of the matched filter.

Specifically, the blocks indicated as $\Sigma_1$ in FIG. 1 are illustrated in FIG. 2. The inputs from x and y are connected to Exclusive-OR gate 21 and to AND gate 22 so as to act as a half adder and provide sum and carry outputs.

In FIG. 3 the inputs are fed half adders 1 and 1A whose outputs are connected as shown to OR gate 23 so as to provide an output word $z_1$ $z_2$, and $z_3$.

FIG. 4 shows the units 3 which consist of half adder 1 having the high inputs fed thereto, a 2x2 bit adder 2 (which is the same as unit 2 of FIG. 3) is provided for the lower input bits. OR gate 31 allows for the combining of the information input an output word.

FIG. 5 generically shows the next higher units which will consist of connecting the highest bits to a half adder 1 and connecting the remaining bits to an adder circuit 33 which will be identical to the network diagram of the last lower echelon. OR gate 34 combines as in FIG. 4 to provide an output word.

FIG. 6 shows the $\Sigma_2'$ network of FIG. 1. The inputs are fed to a half adder network 1 and to an OR circuit 35 so as to provide the output word.

FIG. 7 utilizes a 2x2 bit adder in the manner of FIG. 4. The difference being that no half adder is needed as there is only one high bit input. The high bit and the carry from the adder 2 are fed to OR gate 36.

FIG. 8 is generic representation much as shown in FIG. 5. Again the half adder 1 of FIG. 5 is not needed, and the output is fed directly into one of the inputs of OR gate 37 while the carry output of the adder is fed to the other input of OR gate 37. In this way the desired output word is produced.

I claim:

1. A system comprising first and second half adders each having two inputs and sum and carry outputs; a first network for summing the outputs of said first and second half adders comprising first, second and third outputs which represent a first output word with the third output being the highest bit level; a first OR gate having two inputs and an output; first means connecting the carry output of the first adder to one input of said first OR gate; second means for connecting the sum output of the second half adder to the other input of said OR gate; and third means for utilizing the sum output of said first half adder, the output of said OR gate, and the carry output of said second half adder as the first, second and third outputs of said network.

2. A system for summing a plurality of input signals comprising a plurality of first echelon networks representing lowest order echelon networks; said plurality of first echelon networks contain a plurality of identical first echelon circuits; each first echelon circuit comprising a first one half adder having first and second input terminals, a sum output terminal and a carry output terminal, the input terminals of said first half adder being connected to the input signals to be summed, and output terminals of said first circuits being the sum and carry outputs of each of said first echelon networks; a plurality of second echelon networks for summing the outputs of a next lower echelon networks and representing a next higher order of echelon networks; said plurality of second echelon networks containing a plurality of identical second echelon circuits; each second echelon circuit comprising a further one half adder having first and second input terminals, a sum output terminal and a carry output terminal, a further echelon circuit identical to an echelon circuit in the next lower echelon network, a second echelon OR gate having first and second input terminals and an output terminal, the input terminals of said further half adder and said lower echelon circuit being connected to outputs of pairs of said next lower echelon networks with the carry outputs being connected to the further second half adder only, the carry output terminal of said further echelon circuit being connected to the first input of said second echelon OR gate, the sum output terminal of said further one half adder being connected to said second input of said OR gate, the carry output terminals of said further one half adder being the carry output terminal or highest bit level of the second echelon network, the output terminal of said OR gate being the next highest bit level output of the second echelon network, and output terminals of said lower echelon circuit (except the carry terminal) being the remainder of the outputs of said second echelon network.

3. A system as set forth in claim 2 further comprising a plurality of higher echelon networks with each level of echelon networks being constructed in order and in the same manner as the second echelon networks were constructed.

* * * * *